(12) United States Patent
Dannels

(10) Patent No.: US 8,212,562 B2
(45) Date of Patent: Jul. 3, 2012

(54) METHOD AND APPARATUS FOR DESIGNING AND/OR IMPLEMENTING VARIABLE FLIP ANGLE MRI SPIN ECHO TRAIN

(75) Inventor: Wayne R. Dannels, Mentor, OH (US)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 1 day.

(21) Appl. No.: 12/656,400

(22) Filed: Jan. 28, 2010

(65) Prior Publication Data
US 2011/0181282 A1 Jul. 28, 2011

(51) Int. Cl.
*G01V 3/00* (2006.01)
(52) U.S. Cl. ........................................ 324/309
(58) Field of Classification Search ........... 324/300–322
See application file for complete search history.

(56) References Cited

U.S. PATENT DOCUMENTS

| 6,456,071 | B1 | 9/2002 | Hennig |
| 6,850,063 | B2 | 2/2005 | Hennig |
| 7,164,268 | B2 * | 1/2007 | Mugler et al. ............... 324/307 |
| 7,227,356 | B1 | 6/2007 | Hariharan et al. |

OTHER PUBLICATIONS

Santyr, et al., "Off-Resonance Spin Locking for MR Imaging," *Magn. Reson. Med.*, vol. 32, pp. 43-51 (1994).

Alsop, "The Sensitivity of Low Flip Angle RARE Imaging," *Magn. Reson. Med.*, vol. 37, pp. 176-184 (1997).

Busse, et al., "Fast Spin Echo Sequences with Very Long Echo Trains: Design of Variable Refocusing Flip Angle Schedules and Generation of Clinical $T_2$ Contrast," *Magn. Reson. Med.*, vol. 55, pp. 1030-1037 (2006).

Busse, et al., "Effects of Refocusing Angle Modulation and View Ordering in 3D Fast Spin Echo," *Magn. Reson. Med.*, vol. 60, pp. 640-649 (2008).

Wheaton, et al., "Method for Reduced SAR $T_{1\rho}$- Weighted MRI," *Magn. Res. Med.*, vol. 51, pp. 1096-1102 (2004).

Markkola, et al., "Determination of $T_{1\rho}$ Values for Head and Neck Tissues at 0.1 T: A Comparison to $T_1$ and $T_2$ Relaxation Times," *Mag. Res. Imaging*, vol. 16, No. 4, pp. 377-383 (1998).

Pakin, et al., "Rapid 3D-$T_{1\rho}$ Mapping of the Knee Joint at 3.0T With Parallel Imaging," *Mag. Res. Med.*, vol. 56, pp. 563-571 (2006).

\* cited by examiner

*Primary Examiner* — Dixomara Vargas
(74) *Attorney, Agent, or Firm* — Nixon & Vanderhye PC

(57) ABSTRACT

A variable flip angle (VFA) MRI (magnetic resonance imaging) spin echo train is designed and/or implemented. For example, a target train of detectable spin-locked NMR (nuclear magnetic resonance) echo signal amplitudes may be defined and a corresponding designed sequence of variable amplitude (i.e., variable NMR nutation angle) RF refocusing pulses may be determined for generating that target train of spin echoes in an MRI sequence (e.g., used for acquiring MRI data for a diagnostic imaging scan or the like). Such a designed VFA sequence may be output for study and/or use by an MRI system sequence controller.

22 Claims, 13 Drawing Sheets

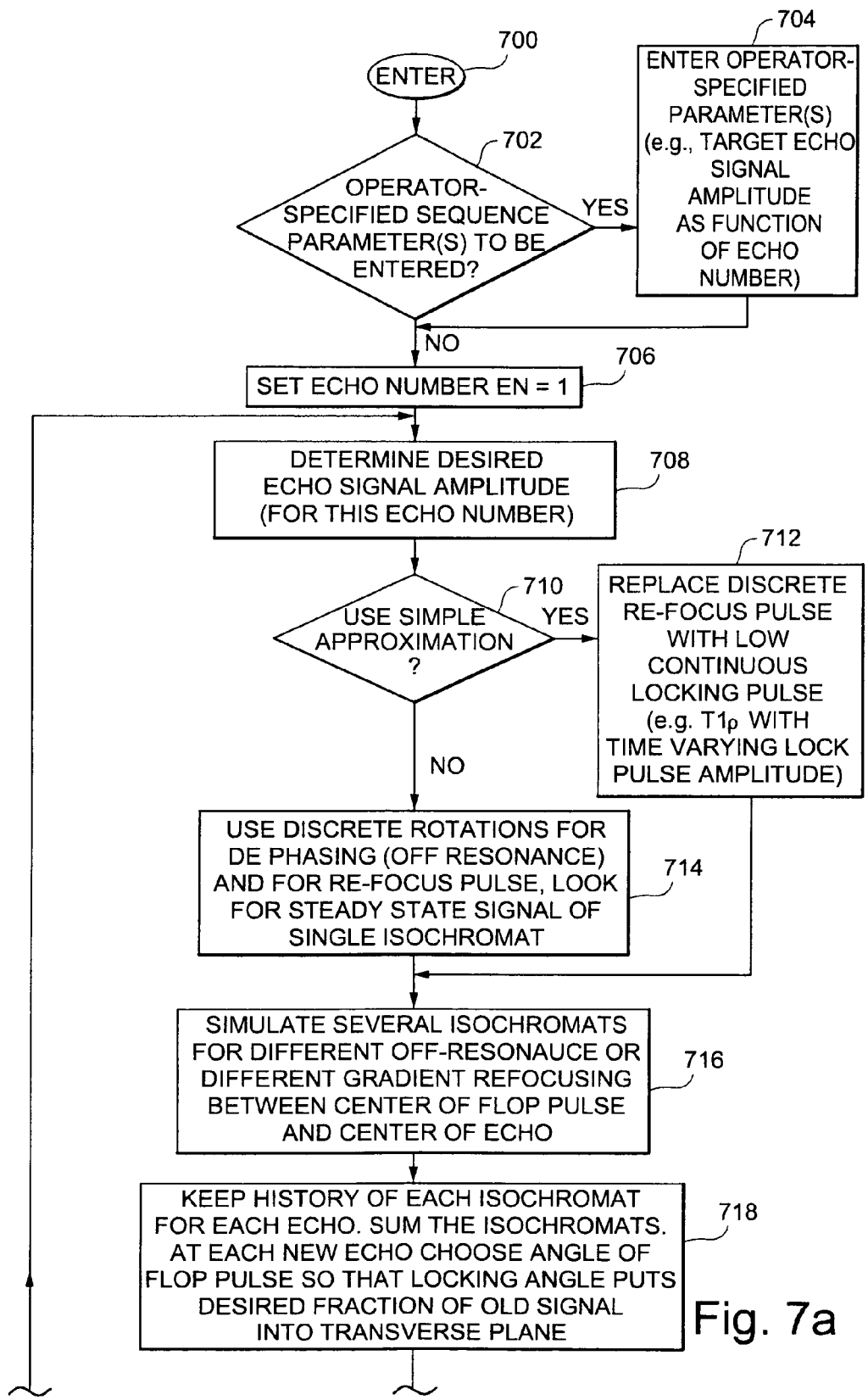

METHOD AND APPARATUS FOR DESIGNING AND/OR IMPLEMENTING VARIABLE FLIP ANGLE MRI SPIN ECHO TRAIN

An appendix comprising a sixteen-page computer program listing is submitted concurrently herewith on duplicate compact discs (CD-ROMs) and is hereby incorporated by reference into this specification in accordance with 37 C.F.R. §1.52(e)(5). This incorporated appendix comprises a single file (dannelsprogram.pdf—created Jan. 27, 2010—468 KB) containing the images of a sixteen-page listing of a computer program exemplary embodiment written in IDL (Interactive Data Language) source code.

BACKGROUND

1. Technical Field

This application describes method and apparatus for designing and/or implementing a variable flip angle (VFA) MRI (magnetic resonance imaging) spin echo train. For example, a target train of detectable spin-locked NMR (nuclear magnetic resonance) echo signal amplitudes may be defined and a designed sequence of variable amplitude (i.e., variable NMR nutation angle) RF refocusing pulses may be determined for generating that target train of spin echoes in an MRI sequence (e.g., used for acquiring MRI data for a diagnostic imaging scan or the like). Such a designed VFA sequence may be output for study and/or use by an MRI system sequence controller.

2. Related Art

Formation of NMR spin echoes and multiple spin echoes is essential in MRI, such as is done in Fast Spin Echo (FSE) sequences. To generate long series of echoes in MRI, it can be advantageous to sweep the echo train from high amplitude initial RF refocusing pulses to lower amplitude pulses, and sometimes sweep back up to higher amplitude pulses again. The purposes can include (1) generating additional usable echoes and faster scan time, or higher resolution scans in the same time, (2) reduced SAR (specific absorption ratio), or scans less limited by SAR, or (3) favorable motion and artifact characteristics.

When a series of echoes is to be achieved, there are nontrivial design constraints and nontrivial objectives to be met. The successive echoes usually should have peaks that form some kind of smooth shape or envelope when they are used in forming k-space arrays and then spatial domain images. More specifically, the point spread in resulting images should be kept narrow and relatively free of ghosts or ringing or aliases. The signal level should be maximized, or the signal-to-noise ratio (SNR) should be maximized. The image contrast, such as the amount of T2 weighting or the amount of T1 weighting, should meet any of several possible goals. These contrast objectives may need to be maintained over a range of tissue types. The image may need to have certain characteristics with respect to motion or flow, such as some moving bodily fluids being bright or dark. The image may need to maintain consistent appearance over a range of off-resonance frequencies. Technical characteristics of the RF refocusing pulse train also must be met, such as peak RF power limits, integrated power limits (e.g., based on SAR), or performance over a range of RF imperfections (B1 spatial inhomogeneity.)

For these reasons, it is necessary to have design methods that determine transmit RF refocusing pulse characteristics for each of a series of refocusing pulses. In particular, MR imagers need ways to determine the amplitude of these RF refocusing pulses (i.e., the amplitude typically corresponds to the integrated area of each individual RF refocusing pulse which, in turn, determines the effective NMR nutation angle $\alpha$ of that particular refocusing pulse). The determination of the refocusing pulse amplitudes should result in improved or optimized image quality and image quality objective metrics, subject to the various technical constraints. The resulting output of the MRI scanner pulse sequence design will include an envelope of the train of RF transmit pulse amplitudes, which can be denoted as a "variable flip angle" (VFA), or which also might be called by names such as "variable refocusing angle", "transmit pulse train envelope", or the like.

The relevance of such designs is well known, especially for scanning applications like high resolution 3D FSE scanning. The importance of such applications may, in general, increase for scanners with higher main magnetic field strengths.

Design of RF refocusing pulse amplitudes for such echo trains is sometimes done using Bloch equation simulations and sometimes done using Hennig's extended phase graph algorithms. Some relevant prior art teachings are identified below:

1. U.S. Pat. No. 6,456,071—Hennig
2. U.S. Pat. No. 7,164,268—Mugler, III, et al.
3. U.S. Pat. No. 6,850,063—Hennig
4. U.S. Pat. No. 7,227,356—Hariharan, et al.
5. Santyr, et al., "Off-Resonance Spin Locking for MR Imaging," *Magn. Reson. Med.*, Vol. 32, pages 43-51 (1994)
6. Alsop, "The Sensitivity of Low Flip Angle RARE Imaging," *Magn. Reson. Med.*, Vol. 37, pages 176-184 (1997)
7. Busse, et al., "Fast Spin Echo Sequences with Very Long Echo Trains: Design of Variable Refocusing Flip Angle Schedules and Generation of Clinical $T_2$ Contrast," *Magn. Reson. Med.*, Vol. 55, pages 1030-1037 (2006)
8. Busse, et al., "Effects of Refocusing Angle Modulation and View Ordering in 3D Fast Spin Echo," *Magn. Reson. Med.*, Vol. 60, pages 640-649 (2008)

Some such prior art approaches use T1 and T2 in the simulation and design of such pulse trains. Others use polynomial approximations. In any event, various of these algorithms are used in "variable flip angle" commercial products previously marketed by major MRI system manufacturers.

Often, a target series of echo signal amplitudes is generated. Then, RF refocusing pulses are calculated that result in the desired (target) detectable echo signal levels. If such a design cannot be generated, then the target signal levels are reduced (perhaps by lowering the overall target signal amplitude) and then the calculation of required RF refocusing pulses is repeated until a realizable design can be generated.

A critical building block needed in most such designs is a way to generate a forward simulation where the RF echo signal level of each successive echo can be computed from a series of RF pulse amplitudes and usually additional parameters such as target tissue relaxation values, T1 and T2.

A target performance is specified, such as a detectable echo signal level to be achieved for some range of echoes, or an entire envelope of target echo signal levels with a distinct target signal level for each echo. Such a target may or may not be feasible. It could be infeasible because signal decay (relaxation) of NMR magnetization is such that not enough magnetization signal persists later in an echo train. It could be infeasible because the RF refocusing pulses needed to generate a given echo signal level at a later time exceed an overriding constraint on the transmit RF signal.

The typical design method involves progressively choosing an RF refocusing pulse amplitude to generate each successive echo so that the target echo signal level is achieved. This is done for all successive echoes until a feasible envelope has been fully calculated, or until it is determined that the target train plan is not feasible. Typically, if the target plan is not feasible, an easier target plan with lower echo amplitudes is chosen, and the process is repeated. Also, if the target plan does yield a feasible RF refocusing pulse amplitude train, then it is common to attempt a higher target echo signal level or some other higher level of performance target. Thus, there may be an actual optimization process which attempts to determine or approximate the highest signal level that is feasible, and the RF pulse design that correspondingly generates it.

As noted above, the forward simulation is usually done with either of two widely-used techniques. A first technique simulates the Bloch equations directly, with finite differences generated according to the differential form of the Bloch equations. These Bloch equations are satisfied for each of a series of isochromats, and a summed total signal (over all isochromats) is then determined for each echo. At each time step, NMR magnetization components $M_x$, $M_y$, and $M_z$ are calculated based upon the RF pulse, off-resonance, relaxation and the previous values of the three magnetization components.

Alternately, a second technique uses the extended phase graph formalization of Prof. Jurgen Hennig. For each RF refocusing pulse, one determines how much of the signal in each harmonic pathway evolves into each of the neighboring harmonic pathways. With the extended phase graph method, the detected signal at each echo corresponds to the signal in the zeroeth or "unencoded" pathway at the time of the echo. With the extended phase graph calculation, it is possible to use a closed-form calculation at each echo to determine what the RF refocusing pulse amplitude must be to generate the next desired echo signal level.

The extended phase graph algorithm can be limited in effectiveness in that it normally only applies to trains with uniform echo spacing, matched gradient moments per each inter-echo interval, and so forth. If the dephasing across a voxel is not a multiple of $2\pi$, or if the signal characteristics across the voxel are not substantially uniform, then the assumption that the detectable (i.e., transverse $M_x$) signal comes from the zeroeth transverse harmonic will not hold true, and the calculation will not match the observed signal.

Algorithms that depend upon T1 and T2 in the simulation models also may not fully describe complex tissues. If the actual MR physics is more complex than the assumptions, then the signals will decay at a different rate or develop oscillations, or both.

Either of these forward calculation methods also has a chance of producing progressively increasing error in a VFA RF refocusing pulse amplitude design, as the echo signal train is calculated from echo-to-echo, especially as the signal level becomes nearly unfeasible and the remaining magnetization is nearly exhausted due to relaxation.

BRIEF SUMMARY

The exemplary embodiments to be described below provide a simplified method for estimating the resulting detectable transverse component of echo signal at each echo in a practical variable flip angle (VFA) pulse sequence. The exemplary techniques involve utilizing a new detectable echo estimation to design/select a corresponding RF transmit refocusing pulse amplitude to produce each successive echo in the target echo train.

The exemplary embodiments track spin-locked magnetization in a rotating frame of reference (i.e., rotating about the static magnetic field $B_o$ at the Larmor frequency). The adopted spin-locking model includes off-resonance effects and involves the calculation of both transverse and longitudinal magnetization ($M_x$ and $M_z$) associated with each successive echo generation. The simulation of detectable (i.e., transverse $M_x$) echo signal depends upon tissue-related T1 and $T1_\rho$ decay constants of NMR relaxation. Each successive RF refocusing pulse in the train to be designed can be chosen by specifying a new required effective spin-locking angle $\delta$. That is, after calculating the expected magnetization decay (using T1 and $T1_\rho$ time constants), a new effective spin-locking angle $\delta$ is chosen so as to change the ratio between transverse $M_x$ and longitudinal $M_z$ echo signal components as required to achieve the desired transverse echo signal $M_x$ for the next target echo. In effect, the new spin-locking angle $\delta$ required to achieve this result is shown to, in turn, determine the amplitude of the RF refocusing pulse next needed for generation of the next target echo.

The exemplary embodiments track the evolution and management of the main spin-locked component of the magnetization signal. Accordingly, they should not lead to unstable train designs (i.e., dominated by a signal far away from equilibrium conditions). The exemplary techniques also can, in effect, ignore artifact-laden signal pathways. For example, when $T1_\rho$ or low-frequency dispersion effects are different than simple T2 effects, the exemplary embodiments herein may be more accurate than T2 models—and may allow for better management of the entire RF echo train design.

To assist in understanding, let it be assumed that off-resonant spin-locked signals precess tightly around an equilibrium angle $\delta$. If so, then for each successive target echo, one may (1) compute the spin-lock angle for the just previous echo, depending upon the just previous RF refocusing amplitude/angle and an off-resonance precession angle; (2) compute the off-resonance $T1_\rho$ decay of the spin-locked net magnetization magnitude; (3) determine a new spin-lock angle $\delta$ required to convert the decayed net magnetization magnitude into a desired detectable transverse magnetization component signal; and (4) compute the next required RF refocusing pulse magnitude/angle based upon the calculated new required spin-lock angle. This same process may be repeated for each successive echo in the target echo train to produce the required train of variable flip angle RF transmit refocusing pulse magnitudes.

In part, the exemplary embodiments are based upon a recognition that even in a variable flip angle sequence, relatively slowly changing RF pulse amplitude can be treated as being similar to an adiabatic pulse so that the effective magnetization signal can be considered as closely spin-locked about an effective RF transmit pulse rotating frame. Perhaps a first stage simple approximation would be to simply replace discrete RF refocusing pulses with a low-amplitude continuous spin-locking signal which results in a $T1_\rho$ time-varying spin-locked pulse amplitude. However, a better approximation used in the exemplary embodiments is to consider, for each of several isochromats, discrete de-phasing rotation by $\beta$ (since the last refocusing pulse) and amplitude decay by the $T1_\rho$ exponential decay factor (e.g., taking into account the off-resonance isochromat value) and then for the required next RF transmit refocusing pulse, look for a corresponding steady-state signal component associated with that single isochromat. This process can, of course, be repeated to simulate several different isochromats for different respectively corresponding off-resonance frequencies and/or different gradient field refocusing employed between the time domain center of a refocusing pulse and the time domain center of the resulting next spin echo response.

Preferably, a history of the calculations for each echo is maintained for each isochromat component. For each new successive target echo, the nutation angle-determining magnitude (i.e., actually related to the magnitude of the area under the envelope of a single refocus pulse) of the RF transmit refocus pulse is chosen so that the new spin-locking angle puts the desired fraction of the available "old" magnetization signal into the desirable transverse plan so as to constitute detectable spin echo response. In performing this determination, the exemplary embodiments are based upon a model which causes magnetization decay in accordance with $T1_\rho^{offset}$ from echo-to-echo.

Special logic or other conditions may also be added to the model so as to achieve other effects. For example, the model may be iteratively implemented so as to maximize the main net magnetization echo signal. The model may also be used to specify an initial set of transient RF refocusing pulses during an initial set-up stage of the MRI sequence to be designed. In addition, after some length of a designed echo signal train, one may also modify the model so as to assume thereafter some predetermined roll-off of RF transmit refocusing pulse train amplitude (e.g., after the k-space "central" spin echo in the entire designed echo train).

Among other novel advantages and objects, the exemplary embodiments provide the following novel features:
 use of $T1_\rho$ or $T1_\rho^{offset}$ in designing VFA echo trains
 tracking the evolution and progression of the spin-locked magnetization (e.g., to keep track of the largest possible detectable signal at each design echo position)
 determining the next RF refocusing amplitude based on history of prior spin-lock angle and magnetization decay at that prior lock angle

BRIEF DESCRIPTION OF THE DRAWINGS

These as well as other advantages and features/objects of the exemplary embodiments will be better understood in light of the following more detailed description of exemplary embodiments taken in conjunction with the accompanying drawings, wherein:

FIGS. 7a and 7b provide a flow chart of computer program code structure for a second exemplary embodiment;

DETAILED DESCRIPTION OF EXEMPLARY EMBODIMENTS

Figure 1:
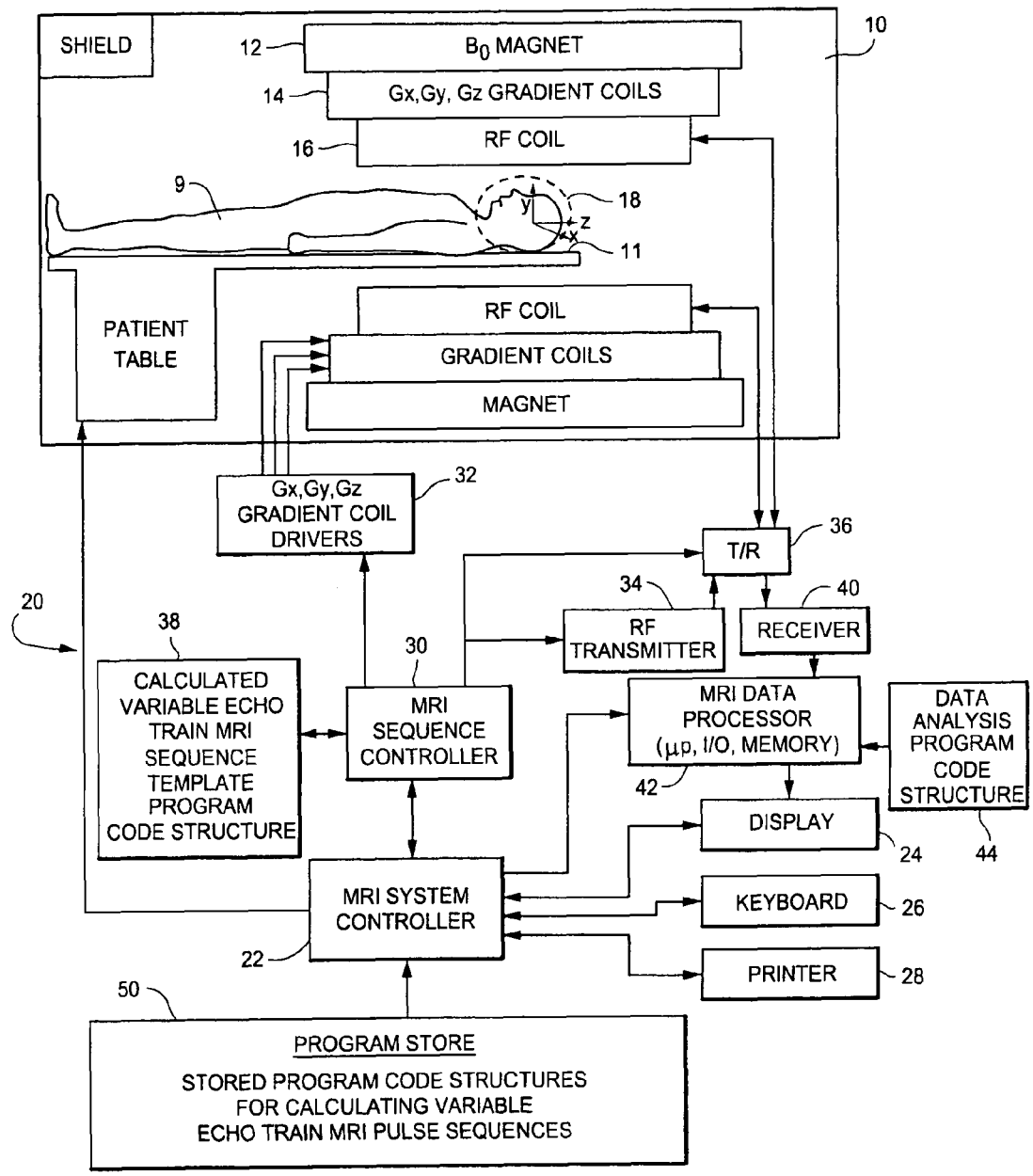
FIG. 1 is a simplified high level block diagram of a typical MRI system modified so as to practice exemplary embodiments of the present invention.

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field $B_o$ magnet 12, a $G_x$, $G_y$ and $G_z$ gradient coil set 14 and an RF coil assembly 16. Along the horizontal axis of this cylindrical array of elements is an imaging volume 18 shown as substantially encompassing the head of a patient 9 supported by a patient table 11.

An MRI system controller 22 has input/output ports connected to display 24, keyboard 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$ and $G_z$ gradient coil drivers 32, as well as the RF transmitter 34 and the transmit/receive switch 36 (if the same RF coil is used for both transmission and reception). The MRI sequence controller 30 includes suitable program code structure 38 for implementing a calculated variable echo train MRI sequence and/or with other (e.g., conventional) MRI sequences already available in the repertoire of the MRI sequence controller 30.

The MRI system 20 includes an RF receiver 40 providing input to data processor 42 so as to create processed image data to display 24. The MRI data processor 42 is configured for access to a data analysis program code structure 44 for deriving, storing and/or displaying MR images based on MRI data acquired from the receiver 40.

Also illustrated in FIG. 1 is a generalized depiction of an MRI system program store 50 where stored program code structures (e.g., for calculating variable echo train MRI pulse sequences) are stored in computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high level simplified diagram of a typical MRI system with some modifications so as to practice exemplary embodiments to be described hereinbelow. The system components can be divided into different logical collections of "boxes" and typically comprise numerous digital signal processors (DSP), microprocessors, special purpose processing circuits (e.g., for fast ND conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of calculation of a variable echo train MRI sequence, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the calculated variable echo train MRI pulse sequence to be used in acquiring MRI data). As those in the art will appreciate, such arrays of stored data values represent and also constitute a physical structure—as does a particular structure of computer control program codes which, when sequentially loaded into instruction registers and executed by one or more CPUs of the MRI system 20, cause a particular sequence of operational states to occur and be transitioned through within the MRI system.

The exemplary embodiments described below provide superior ways to calculate a variable flip angle echo train MRI pulse sequence for MRI data acquisition.

Figure 2A:
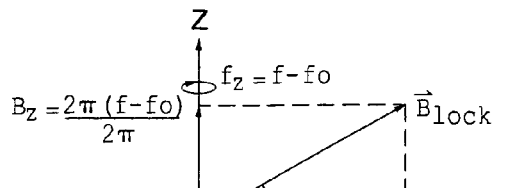
FIGS. 2a, 2b, 2c, 2d and 2e are graphical depictions of NMR magnetization species in a rotating reference frame defined by the static magnetic field $B_o$ of the exemplary MRI system of FIG. 1.

FIG. 2a depicts the situation in a rotating reference frame defined by the well known Larmor equation which relates the NMR frequency to the strength of the static magnetic field $B_o$ (aligned parallel to the z-axis) and the gyromagnetic ratio $\gamma$. Typical commercial MRI systems have $B_o$ magnitudes in the range of 0.5 to 3.0 Tesla and thus define rotating reference frames (e.g., for hydrogen nuclei) which rotate at tens of MHz.

A locking RF pulse $B_x$ applied on resonance, combined with a possible off resonance of the NMR nuclei, will yield an effective rotation in the rotating frame about a vector $B_{lock}$. If the net magnetization is spin-locked (e.g., with a low level continuous RF locking transmission), then the net magnetization will be angularly offset from the transverse x-y plane by the spin-locking angle $\delta$. $B_{lock}$ is composed of the two components $B_x$ and $B_z$. Typically, the rotation rates $f_x$ and $f_z$ are in the range of perhaps 0.1-2.0 KHz—i.e., much, much less than the rotation rate of the rotating frame of reference defined by $B_o$.

Figure 2B:
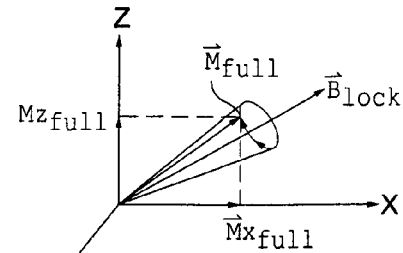

Within that rotating reference frame, a population of NMR (nuclear magnetic resonant) atomic species will produce a net magnetization vector $M_{full}$. As shown in FIG. 2b, the NMR magnetization will rotate along a cone-shaped locus about the locking angle. In the most simple case, this magnetization may be associated with a single isochromat. At any point in time, the isochromat can be described by a vector with components $M_{xfull}$ and $M_{zfull}$. $M_{yfull}$ is not explicitly sketched in FIG. 2b as it turns out that depending upon the exact implementation, knowledge of $M_{yfull}$ may never be required. Conveniently, in typical VFA FSE pulse sequences which satisfy the Carr Purcell Meiboom Gill (CPMG) condition, the $M_{yfull}$ component is zero or small and unimportant, so it can often be left out of analyses.

Figure 2C:
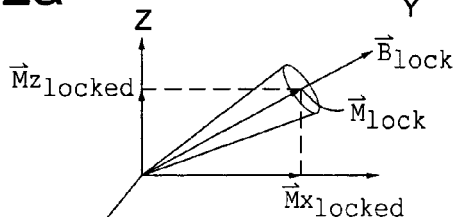

In analysis of spin locking, it is typical to pay special attention to the portion of the full magnetization vector which is obtained by projection onto the effective locking pulse. FIG. 2c shows this component, designated as $M_{locked}$. $M_{locked}$ is the component which decays, as described by the parameter $T1_\rho^{offset}$. To describe $M_{locked}$ in at least some basic spin locking sequences and in some simple models of CPMG FSE sequences, it is sufficient to specify the two components $M_{xlocked}$ and $M_{zlocked}$.

Figure 2D:
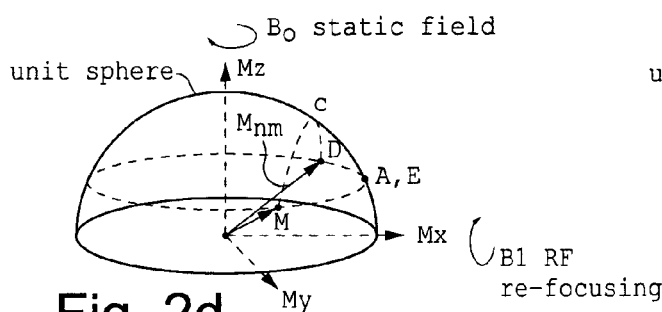
Figure 2E:
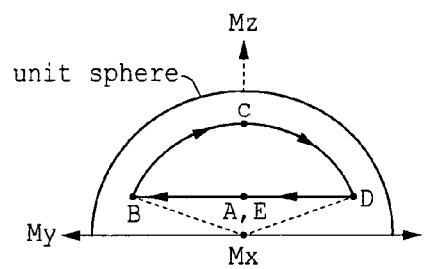

Useful observations may be made in this rotating reference frame by considering movements of the magnetization vector about a unit sphere as depicted in FIGS. 2d and 2e.

Assume one wishes to find a transverse component $M_x$ of a spin-locked echo signal in steady-state analysis of a FSE sequence with variable flip angle, as a function of the refocusing RF transmit magnitude (i.e., a "flop" angle $\alpha$ proportional to the integrated area under the envelope of a refocusing pulse) at an off-resonance isochromat. Assume a CPMG case and look at the trajectory of CPMG magnetization on the unit sphere. Initially, for one isochromat, magnitude relaxation effects will be ignored so as to facilitate explanation.

Assume echo magnetization starts at A, de-phases to B in time (ETS/2=one-half the inter-echo time) by angle $\beta$. Then an applied RF refocusing flop pulse rotates the magnetization from B to C to D in FIGS. 2d and 2e. The magnetization is then rephased from D to A, E in preparation for a next echo (also in time ETS/2).

Simple trigonometry can be used to calculate location B or D (e.g., B and D are effectively the same, by symmetry, since they are reflected to an opposite $M_y$ value across the x-z plane).

FIG. 2e provides a view of the unit sphere from a front view looking straight down the $M_x$ axis.

Using this model, it can be shown that the following approximate formula can be used to relate a spin-locking angle $\delta$ to an RF transmit refocusing pulse angle/amplitude $\alpha$ and the de-phasing angle $\beta$ associated with a particular off-resonance (or perhaps gradient spoiling) effect—i.e., the de-phasing angle through which the magnetization has precessed with respect to the initial on-frequency earlier refocusing pulse alignment (e.g., deviation from the x-axis in the rotating frame of reference since the applied RF refocusing pulses utilize a transverse B1 magnetic field along the x direction of the rotating frame):

$$\delta = \arccos\sqrt{\frac{1+\cot^2\beta}{1+\cot^2\beta+\cot^2(\alpha/2)}} \qquad \text{Equation (1)}$$

Figure 3:
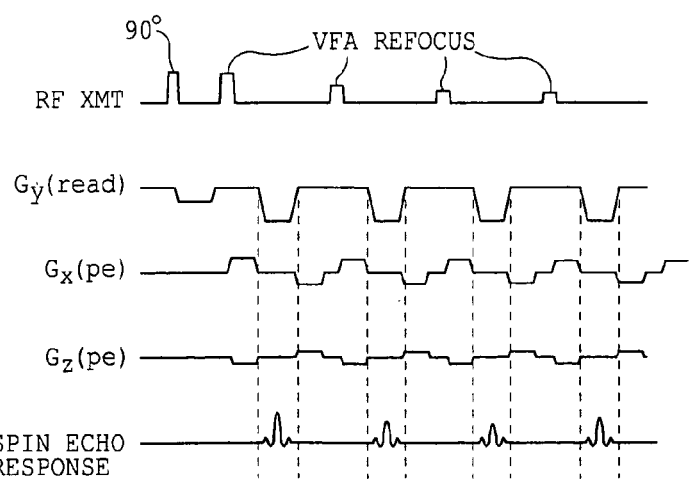
FIG. 3 is a simplified graphical depiction of a designed variable flip angle MRI data acquisition sequence in the time domain based on an exemplary embodiment.

While the above simplified explanation started out assuming low level continuous RF spin-locking, the above approximate formula has been derived and is valid for a spin-locking area associated with a "comb" envelope of short RF refocusing pulses surrounded by longer durations of off-resonance precession (and, of course, having a lower average level than the individual refocusing pulse amplitudes). A portion of a typical such VFA MRI data acquisition sequence is depicted in FIG. 3 where the train of variable flip angle RF refocusing pulses (sometimes referred to as "flop" pulses) is shown on the top line and the resulting train of spin echo signals is shown on the bottom line. The accompanying sequences of $G_x$, $G_y$, $G_z$ gradient magnetic pulses are also a necessary part of an MRI data acquisition sequence. The full echo train is typically repeated several times, separated by a timing interval TR, with varying phase encode gradient amplitudes, as those in the art will understand.

Of course, the formula of Equation (1) breaks down when the refocusing angle $\alpha$ is zero since, at this condition, there is no spin-locking or detectable echo signal, thus presenting an indeterminate condition. In detailed embodiments of this method, it may be prudent to explicitly check for refocusing angles very near zero, but such low angles are not normally encountered in the resulting VFA pulse sequence design.

The exemplary embodiments preferably utilize "brute force" root finding (e.g., iterative numerical solution) techniques where assumed solutions are always near equilibrium spin-locking conditions so as to avoid such indeterminate possibilities. At the moment, there is no known "closed" solution for the above-presented approximate formula of Equation (1).

Figure 4:
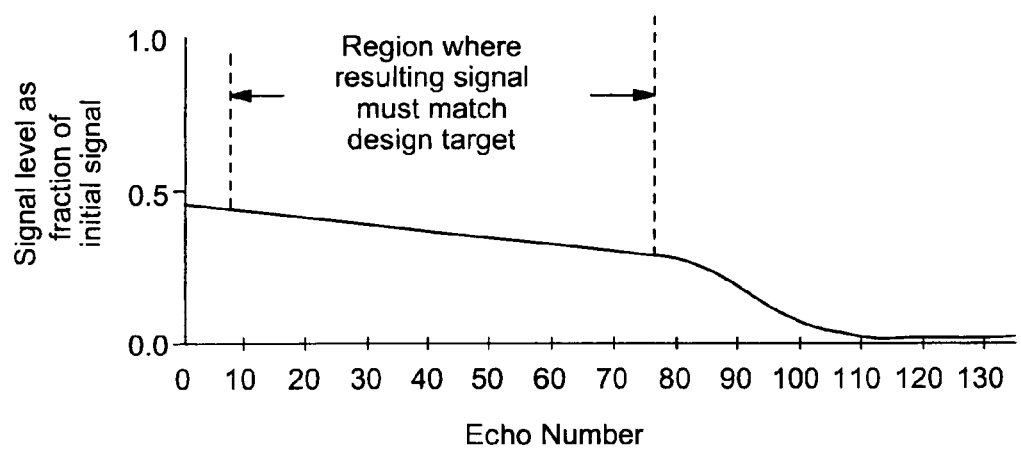
FIGS. 4 and 5 respectively schematically depict an exemplary input target echo train and, based thereon, a calculated output train of RF refocus pulse magnitudes in accordance with an exemplary embodiment.

As depicted in FIG. 4, an input target echo amplitude may have an almost linearly decreasing segment for some considerable number of echoes (e.g., to about echo 78 in FIG. 4) before the target echo amplitudes enter an approximately exponential decay segment. Optionally, the target envelope may be composed of regions where a good match is required between the target and the resulting signal when generating VFA pulse designs, and the target envelope may have one or more regions where the resulting signal is not required to match the target closely (e.g., see FIG. 4). For example, an input target echo magnitude envelope may have an initial transition segment (of a few echoes, e.g., 4-8), and the signal may be allowed to deviate in that region relative to a target. Similarly, some later echoes may be generated using an alternate design rule, and may not be required to have signal so closely matching a predetermined target.

Figure 5:
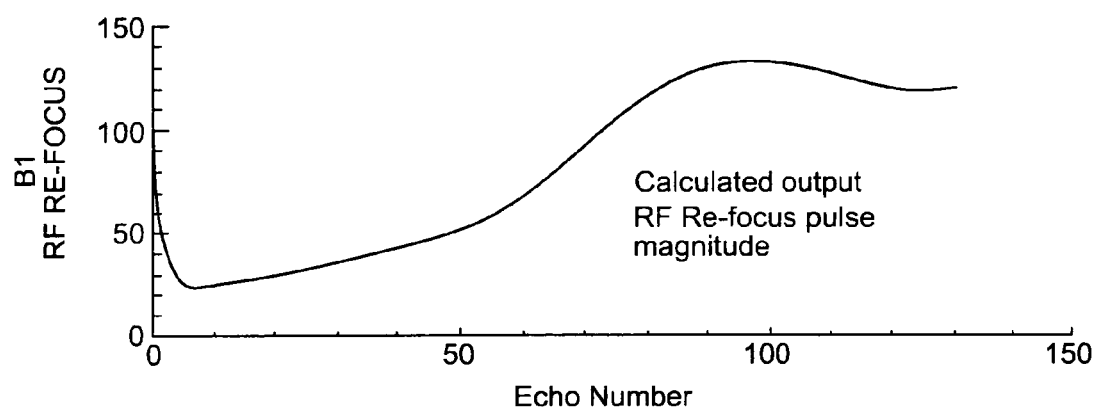

To achieve this target echo train, the exemplary embodiment produces a corresponding calculated train of RF refocusing pulse amplitudes as schematically depicted in FIG. 5 which fall off significantly during the initial transition phase, but then increase significantly over the main echo train where relatively close matching is required (e.g., to echo 78) and beyond attempting to maintain the desired target echo signals. After the main echo (e.g., echo 78), one may follow a tangent (e.g., see FIG. 5) for some time before falling back to some realizable terminal value. Of course, as will be understood, the target echo signals are chosen with some idea of what might be physically realizable in the real world—otherwise, the simulation process will break down and terminate prematurely.

Figure 6:
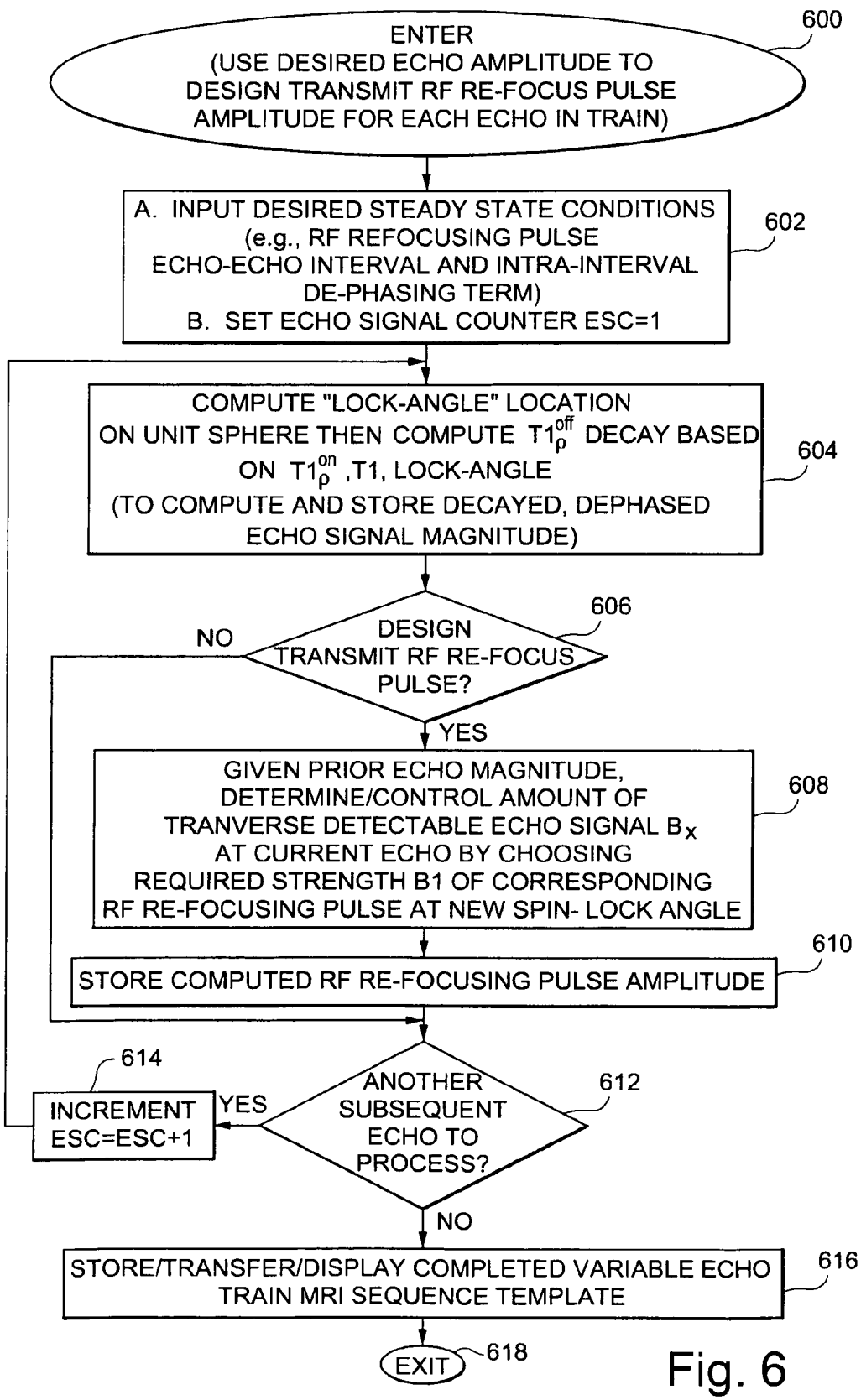
FIG. 6 is a high level flow chart of a first exemplary embodiment of computer program code structure that may be used in the exemplary embodiment of FIG. 1.

The exemplary embodiment depicted in FIG. 6 involves calculations based on some assumptions and formulae. In general, the calculations make use of an observation that, for a well-designed RF echo train, the actual detectable echo signals will not deviate too much from a stable, steady-state signal solution. This is the physical motivation behind approximations such as using the projection of the locked signal onto the locking angle.

Entry into the exemplary embodiment simulation module of FIG. 6 comes at block 600. Here, a desired target train of echo amplitudes may be input by a user or otherwise determined (e.g., based on some desired design algorithm). The exemplary embodiment then proceeds to design the required transmit RF refocus pulse amplitude associated with each successive echo in the target train.

If not already specified (e.g., in the program module itself), desired steady-state conditions are input at 602 (e.g., the echo-echo intervals between respective RF refocusing pulses and the intra-interval de-phasing term $\beta$, the decay factor $T1_\rho$, etc.). An echo signal counter ESC is also initialized before entering the echo-by-echo design loop comprising boxes 604, 606, 608, 610, 612 and 614. At step 604, for an assumed steady-state condition (described by the prior RF refocusing pulse within an echo-echo interval and a de-phasing term for the echo-echo interval), the location of such "steady-state" signal on the unit sphere is calculated to determine a current spin-lock angle $\delta$. Signal components located near this lock-angle position will decay at a rate described by $T1_\rho^{\textit{off}}$. Utilizing the hypothesis that the off-resonance $T1_\rho$ can be computed (or estimated) from the standard on-resonance $T1_\rho$, T1 and the spin-lock angle $\delta$, such decay is computed and stored at 604.

An option is presented at 606 as to whether or not the algorithm is to be employed to actually design transmit RF refocus pulses. If not, then control is passed to the echo calculation loop test at 612 and only a pure forward calculation of echo signals will have been achieved. This may be useful, for example, if all of the RF transmit refocus pulses have already been fully specified in advance for the target train and one wishes only to determine the resulting echo signal magnitudes. In this instance, the algorithm for designing the RF transmit pulse amplitudes is bypassed. Nevertheless, the calculation of echo signal magnitudes may still be useful in analyzing or describing aspects of the target scan. For example, perhaps the simulation could be used to inform the operator of the MRI scan system or to inform a radiologist interpreting a resulting image about expected SNR or resolution or image contrast or the like.

If the RF refocus transmit pulses are to be designed, then control is passed to block 608. Here, given a prior echo magnitude (e.g., at or near the spin-lock angle for that echo), the target amount of transverse (i.e., detectable) echo signal can be achieved by choosing an appropriate new spin-lock angle $\delta$ which, in turn, determines the required strength (i.e., nutation angle) of the next RF refocusing pulse in the train under design. That is, using the above-described approximate formula relating to variables $\delta$, $\beta$ and $\alpha$, since $\delta$ and $\beta$ are now known quantities, the only unknown quantity is the required RF refocusing pulse nutation angle $\alpha$—and that can be determined using the approximated formula of Equation (1) and suitable numerical solution techniques so as to derive a non-closed-form solution for $\alpha$.

The computed RF refocusing pulse amplitude of the next RF refocusing pulse is then stored at 610 before the loop counter is tested at 612 for possible further iterations with respect to other echoes of the target echo train. Finally, when all desired echoes of the train have been simulated (and corresponding RF refocusing pulse amplitudes calculated and stored away), the completed computational results may be stored/transferred/displayed as a complete variable echo train MRI sequence template (e.g., in the program store 38 of FIG. 1).

As those in the art will appreciate, one or more programmed processors within the MRI system (e.g., the MRI system controller 22) may access a program store (e.g., program store 50 in FIG. 1) so as to process the simulation algorithm calculating variable flip angle MRI echo train pulse sequences. The result may then be transferred to other memory/processors of the system as required (e.g., to the program store 38 for use by the MRI sequence controller 30 if an actual diagnostic scan is to be effected using the calculated variable echo train MRI sequence template).

If the design option is accepted at 606, then not only are successive echo signal strengths computed (or accepted as targets), but one also simultaneously selects/designs RF refocusing pulse amplitudes for each of successive echoes. Typically, the computed echo signal levels will substantially match the desired target signal levels (e.g., by virtue of choosing an appropriate RF refocusing pulse amplitude in association with each successive echo). In this manner, the program code of FIG. 6 may be used to "design" a significant part of the MRI VFA scan sequence which may then be executed on the MRI system scanner hardware.

It should also be appreciated that, although it is not explicitly reflected in FIG. 6, the calculations for the echo train can be accomplished either for a single isochromat or they can be accomplished for a distribution of isochromats and then summed to provide a composite output.

As those in the art will appreciate, the number of isochromats utilized in such calculations is preferably at least twice the number of spin echoes in the complete sequence so as to avoid or minimize artifacts caused by effects such as aliasing.

As those in the art will also appreciate, the decay parameter $T1_\rho$ is tissue-specific. That is, for each species of NMR nuclei, there may be a different value of $T1_\rho$ decay. Typically this exponential decay factor is in the range of 30-300 ms or so for most nuclei species of interest. Such values, if not already known and determined, may be experimentally determined in accordance with standard, well known procedures. For example, see:

Wheaton, et al., "Method for Reduced SAR $T_{1\rho}$-Weighted MRI", *Magn. Reson. Med.*, 51:1096-1102 (2004);

Markkola, et al., "Determination of $T_{1\rho}$ Values for Head and Neck Tissues at 0.1 T: A comparison to $T_1$ and $T_2$ Relaxation Times", *Magn. Reson. Imaging*, Vol. 16, No. 4, pp. 377-383 (1998); and Pakin, et al., "Rapid 3D-$T_{1\rho}$ Mapping of the Knee Joint at 3.0T With Parallel Imaging", *Magn. Reson. Med.*, 56:563-571 (2006).

A more detailed explanation of exemplary simulation calculations for the embodiment of FIG. 6 are now described. For example, consider a magnetization signal that is spin-locked at an angle δ. In such a case, the off-resonance $T_{1\rho}$ relaxation over a single echo-to-echo interval (or equivalently, in an interval from one RF refocusing pulse to the next) can be hypothesized to conform to the following equations:

$$\text{decay\_T1\_rho} = e^{(-\text{echospacing}/T1\_rho)} \quad \text{Equation (2)}$$

$$\text{decay\_T1} = e^{(-\text{echospacing}/T1)} \quad \text{Equation (3)}$$

$$\text{decay\_T1\_rho\_off} = \quad \text{Equation (4)}$$
$$\sqrt{(\cos(\delta) * \text{decay\_T1\_rho})^2 + (\sin(\delta) * \text{decay\_T1})^2}$$

$$Mlock(magnitudenew) = \quad \text{Equation (5)}$$
$$\text{decay\_T1\_rho\_off} * Mlock(magnitudedd)$$

$$Mz = \sin(\delta) * Mlock \quad \text{Equation (6)}$$

$$M(\text{transverse}) = \cos(\delta) * Mlock \quad \text{Equation (7)}$$

As those in the art may appreciate, the above-noted Equation (5) may be used in step 604 to compute the decayed magnetization magnitude, while Equation (7) may be used in step 608 to determine the new spin-lock angle δ required for a given transverse component of magnetization (e.g., a target detectable signal level).

Figure 7B:
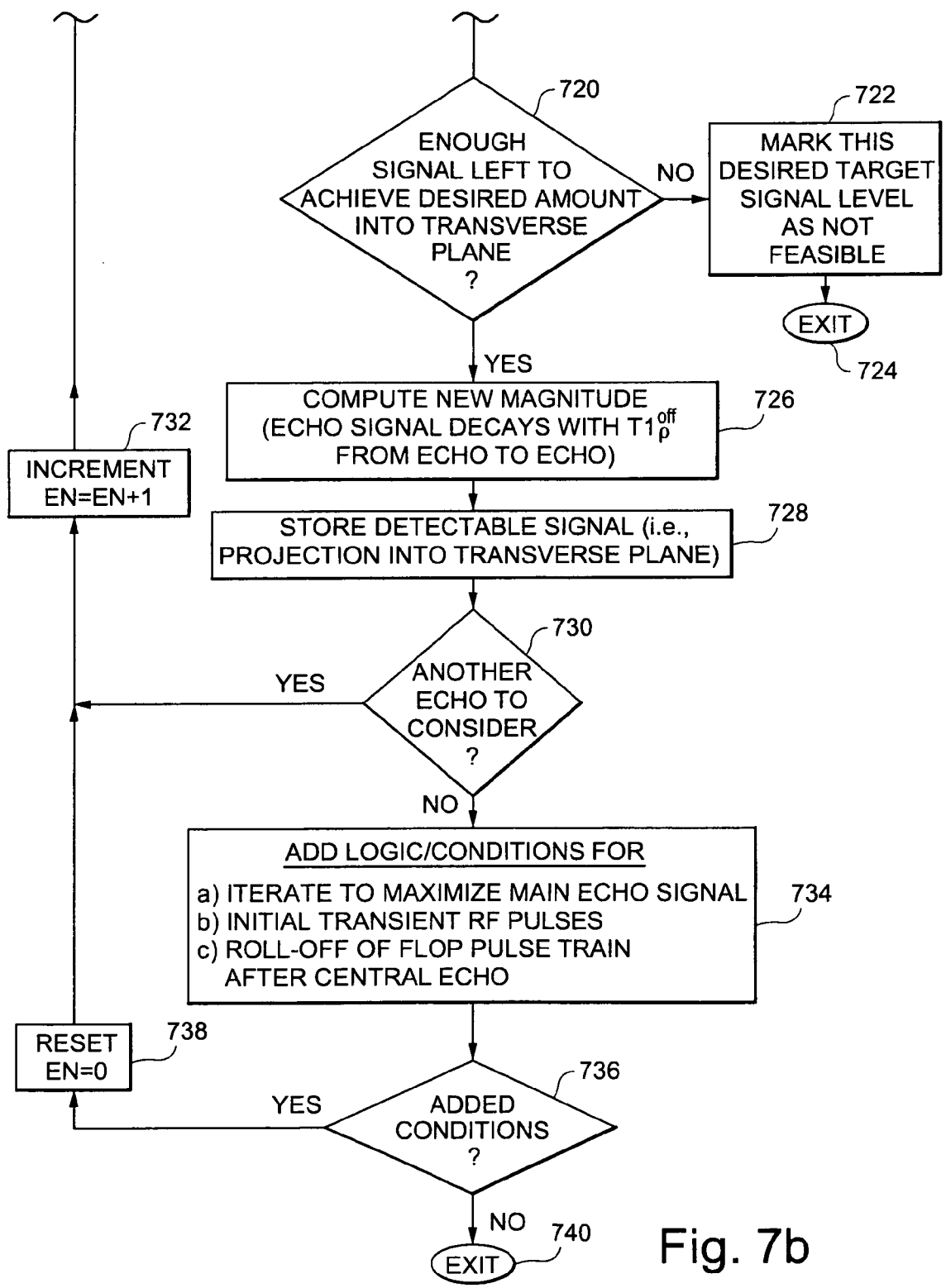
Figure 8A:
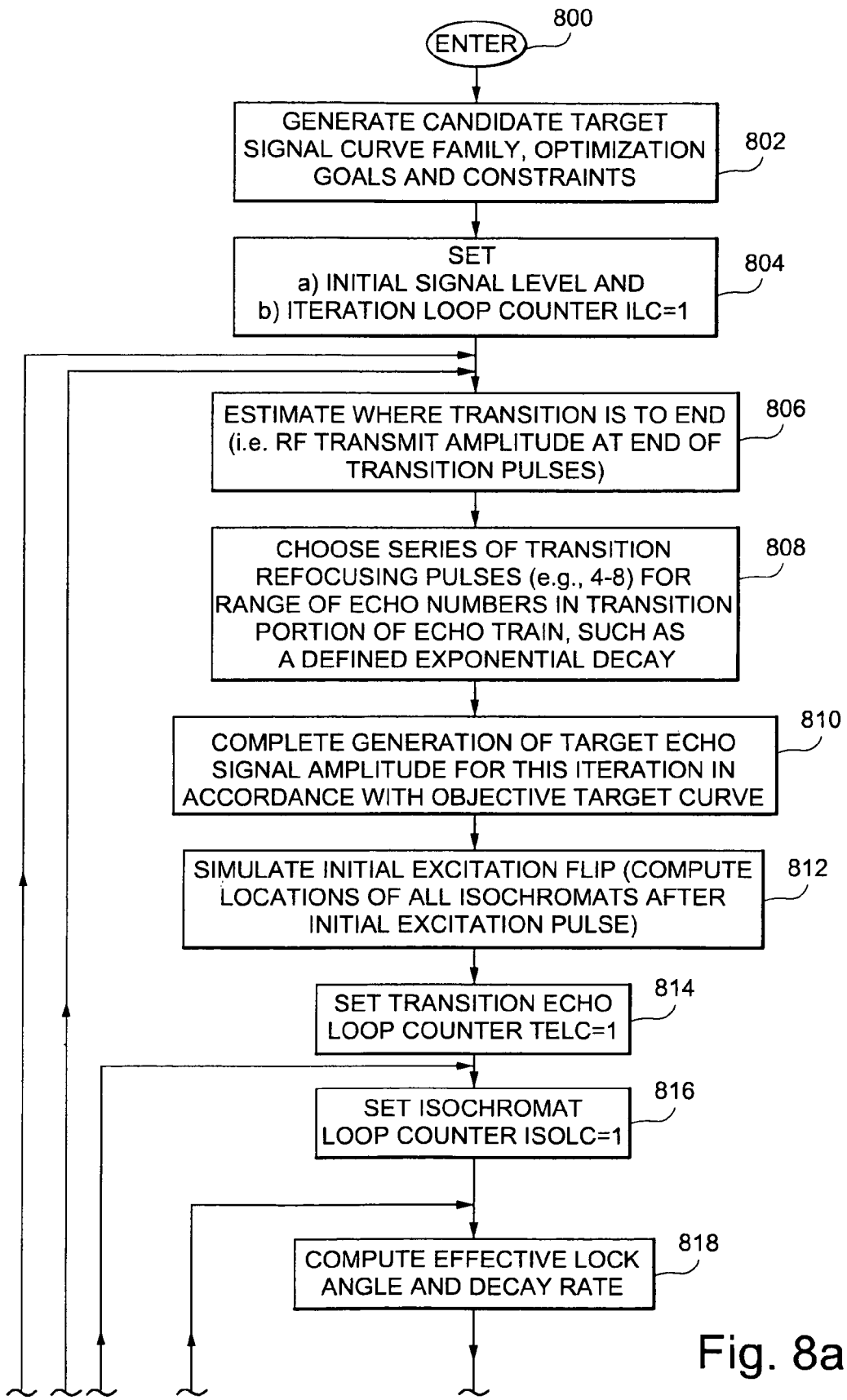
FIGS. 8a, 8b, 8c, and 8d provide a high level flow chart for computer program code structure in accordance with a third exemplary embodiment.
Figure 8B:
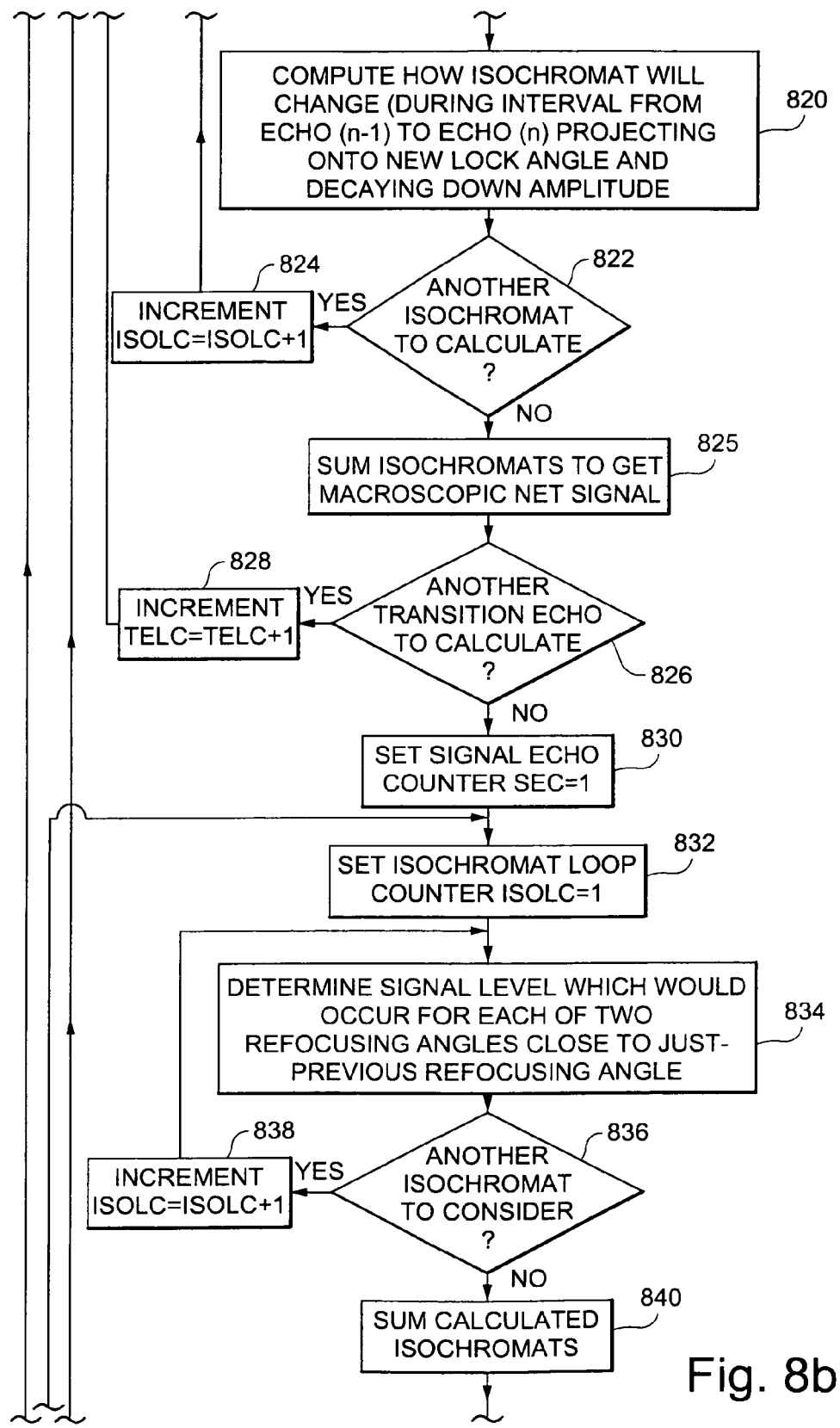
Figure 8C:
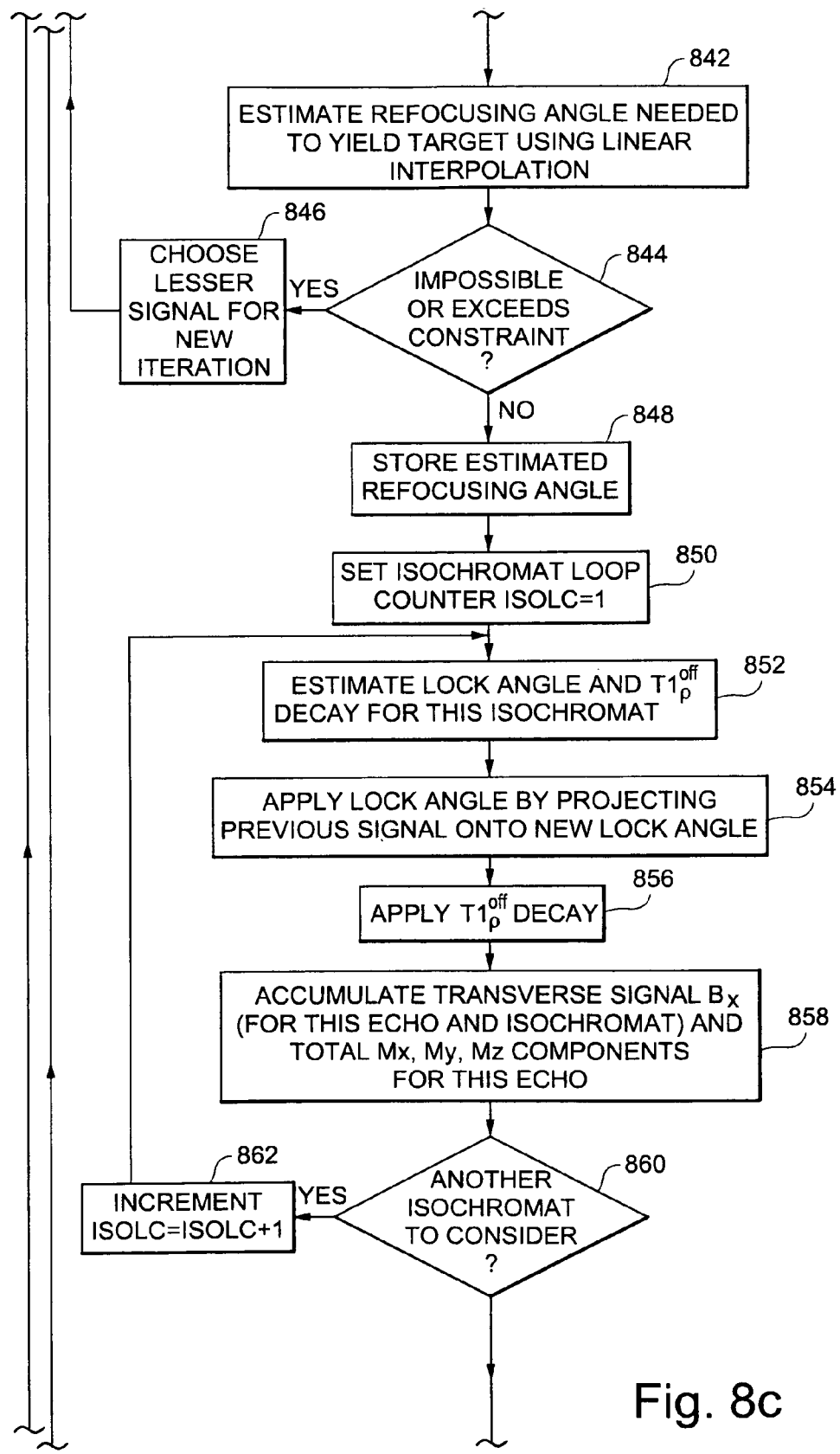
Figure 8D:
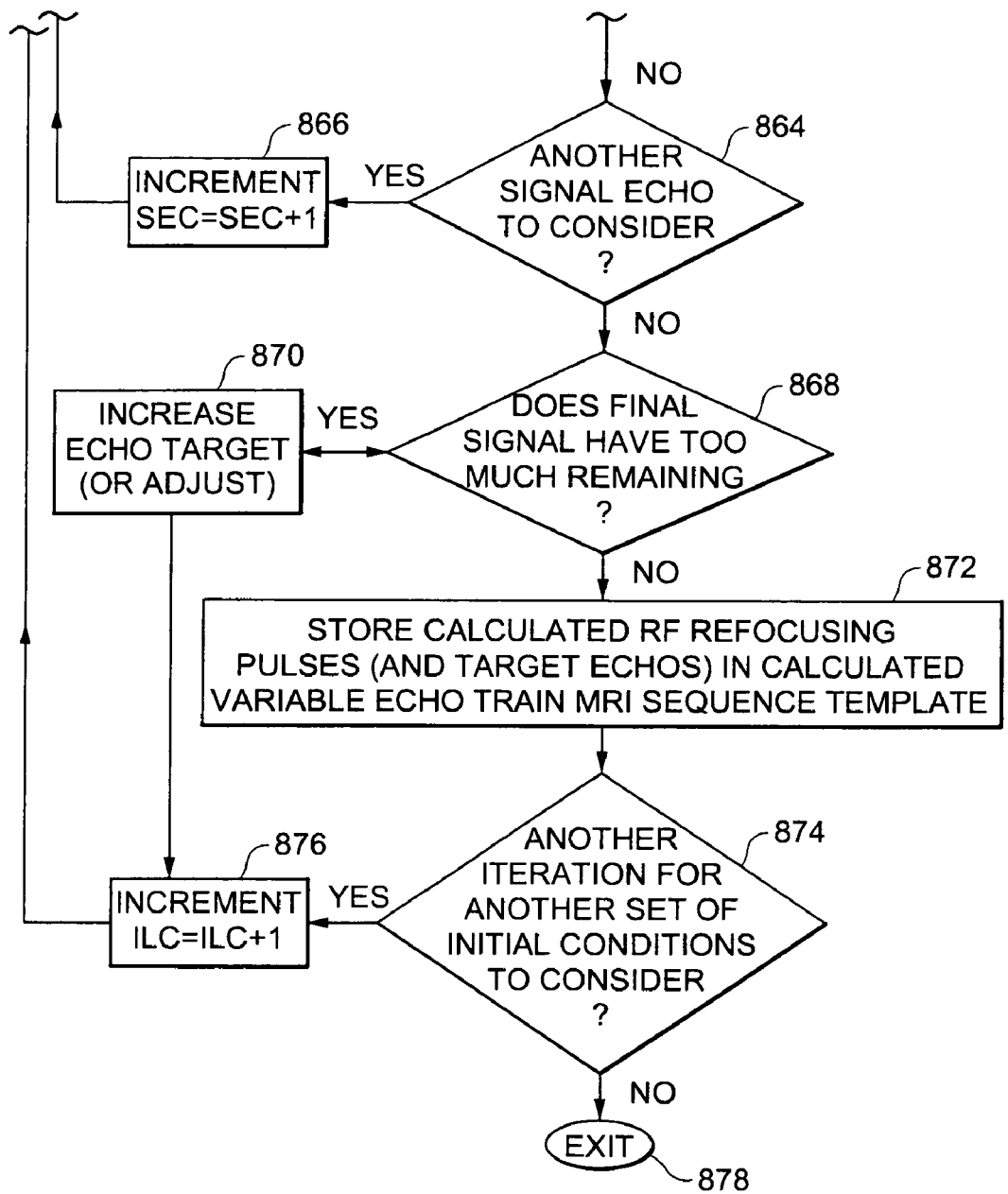

A slightly refined exemplary embodiment is depicted in FIGS. 7a and 7b. Here, after entry at 700, a decision is made at 702 as to whether operator-specified sequence parameters are to be entered. If so, such are entered at 704. Of course, such parameters may involve pre-stored parameters and operator selection of different combinations and permutations of same—or an entirely pre-stored set of sequence parameters for given desired situations or the like.

In any event, once a desired target signal level (signal amplitude as a function of echo number) has been determined, then an echo number loop counter EN is set at 706 and the particular desired echo signal amplitude for that echo number is then determined at 708. A determination is made at 710 as to whether or not a simple approximation is to be used. In either case, in a variable flip angle sequence, slowly changing discrete RF pulses can be considered as functionally similar to an adiabatic pulse so that detectable signals should be closely spin-locked about an effective RF transmit rotating frame pulse as described above. If a simple approximation is to be employed, then at 712, a discrete refocus pulse may, in effect, be considered as having been replaced with a low continuous locking pulse (e.g., $T_{1\rho}$ with a time varying lock pulse amplitude). If not, then a better approximation is employed at 714 where discrete de-phasing rotations are calculated (for each off-resonant isochromat) and for a given refocus RF pulse, the steady-state signal associated with a single isochromat is determined.

At step 716, several different isochromats are simulated for different off-resonance (or different magnetic gradient refocusing) between the time domain center of a refocusing or "flop" pulse and the time domain center of the associated spin echo.

At step 718, a historical record for each isochromat is maintained for each echo. The accumulated isochromats are summed and, at each new echo, the magnitude of RF refocusing pulse (i.e., its nutation angle) is chosen so that the spin-locking angle δ places a desired fraction of the summed isochromat composite signal into the transverse x-y plane (i.e., such that it is detectable). For example, as the magnetization decays, a smaller spin-locking angle (as measured from the x axis) is needed to maintain the same $M_x$ transverse component of magnetization. A test is made at 720 to make sure that there was enough net magnetization $M_{nm}$ signal (i.e., the hypotenuse of a right triangle having legs $M_x$ and $M_z$) left at this stage to achieve the desired design amount of detectable signal into the transverse plane. If not, then step 722 marks that desired signal target level as not feasible and the simulation routine is exited at 724. However, if there is sufficient signal net magnetization magnitude to continue, then the new magnitude of spin-locked signal is calculated at 726 using the approximate $T_{1\rho}^{\text{off}}$ decay factor from the last echo to the next-to-be generated echo. The resulting detectable signal (i.e., projected into the transverse x-y plane) is stored at 728 before an echo loop test is made at 730. If there is another echo to be considered in the target train, then the echo number counter EN is incremented at 732 and control is returned to step 708.

After all echoes in the train have been considered, then control may pass to step 734 where added optional logic conditions may be encountered and treated. For example, further iterations of the simulation routine may be used to maximize the available main echo signal. The initial set of transient RF pulses may be calculated at the beginning of the designed train. A roll-off the designed echo train may be imposed to occur after the central echo of the train. Other such conditions may be imposed as will be appreciated by those in the art. If there are such added logic conditions to be considered, a test is made at 736 and the echo number counter is reset at 738 for a complete further set of iterations. If not, then exit is taken at 740.

A yet more detailed exemplary embodiment is depicted at FIGS. 8a, 8b, 8c and 8d. Here, after entry at step 800, a candidate target signal curve family, optimization goals and constraints are generated at step 802. An initial signal level iteration loop is then begun at 804 with the iteration loop counter (ILC) being set to an initial condition.

The transition echoes loop can have distinct logic because there may be no constraint to hit a particular target signal level. Instead, one can use an empirical exponential decay of the initial few (e.g., 4-8) refocusing pulses that is known to quickly get the signal down to a low refocusing angle steady-state, where the signal is almost all spin-locked near that steady-state condition.

At step 806, an estimate is made as to where the initialization transition is to end; that is, the desired RF transmit pulse amplitude at the end of an initial transition period.

At step 808, a series of transition refocusing pulses is chosen for the range of echo numbers in the transition part of the echo train, such as a rather steep exponential decay (e.g., the number of transition pulses might commonly be in the range of 4 to 8).

At step 810, the generation of target signal for this iteration is completed (e.g., the objective target envelope curve is defined at this signal level), which may be flat with the amplitude of the prescribed signal level or, in the example curve described herein, a linearly decreasing slope across some initial range of echoes.

At step 812, an initial NMR excitation RF flip pulse is simulated (e.g., including computation of locations of all isochromats therein after the excitation pulse).

At step 814, a transition loop over the transition echoes is begun where an index counter (TELC) is used to indicate the current echo number. At step 816, an isochromat loop counter (ISOLC) is set. At step 818, the effective spin-lock angle and decay rate are computed. At step 820, computations are made to define how each isochromat will change (during the interval from echo N−1 to echo N), projecting onto the new spin-lock angle, and decaying down in magnitude with $T1_\rho^{off}$. At step 822, 824, 825, the isochromat loop is ended and the macroscopic net signal (e.g., the sum over all isochromats) is calculated. At steps 826, 828, the transition echo loop is completed.

At step 830, a signal echoes loop is initiated. At step 832, another isochromat loop is entered, summing over isochromats, to determine at step 834 the signal level which would occur for each of two possible refocusing nutation angles, each of which are purposefully chosen to be close to the previous refocusing angle α—and hopefully straddling the desired optimum refocusing angle to be determined. This isochromat loop is completed at steps 836, 838, 840.

At step 842, linear interpolation between the two possible signal levels is used to get an estimate of what optimum refocusing angle α will yield the target. At step 844, a test is made. If impossible, or if a constraint is exceeded, then this iteration is exited at step 846 and a lesser target signal is chosen for another iteration. Otherwise, at step 848, the determined "optimum" refocusing nutation angle α (e.g., as chosen by interpolation processes) is stored.

At step 850, another isochromat loop is entered. At step 852, for the given isochromat, spin-lock angle and decay are estimated. At step 854, spin-lock is applied by projecting the previous signal onto a new spin-lock angle. At step 856, decay is applied. At step 858, the transverse signal is accumulated (at that given echo and isochromat) into a total signal for that echo ($M_x$, $M_y$ and $M_z$ components). It is appreciated that in simple pulse sequence cases, $M_y$ will be small, and its calculation may be skipped. The isochromats loop is completed at steps 860, 862. The signal echoes loop is completed at steps 864, 866.

At step 868, if the final signal has "too much" remaining magnetization, then the target signal can be increased (i.e., adjusted) at step 870. For example, a plausible adjustment could be changing the linear slope across echoes. The loop counter (ILC) is then incremented at step 876 and control is returned for another iteration.

The target iteration loop is completed at steps 874, 876 for exit at step 878, whereupon a final output of RF refocusing pulse amplitudes at each echo is available (e.g., for display, storage and/or use).

The previously incorporated program source code in the appendix is written in a language known as IDL. An input train of target detectable transverse echo components shown in FIG. 9a produces an output train of RF refocus pulse magnitudes as depicted in FIG. 9b in accordance with this exemplary program code. The actual simulated echo signals resulting from the calculated train of RF refocus pulses (including other input constraints besides the desired target train input of FIG. 9a) is also depicted at FIG. 9c.

Figure 9A:
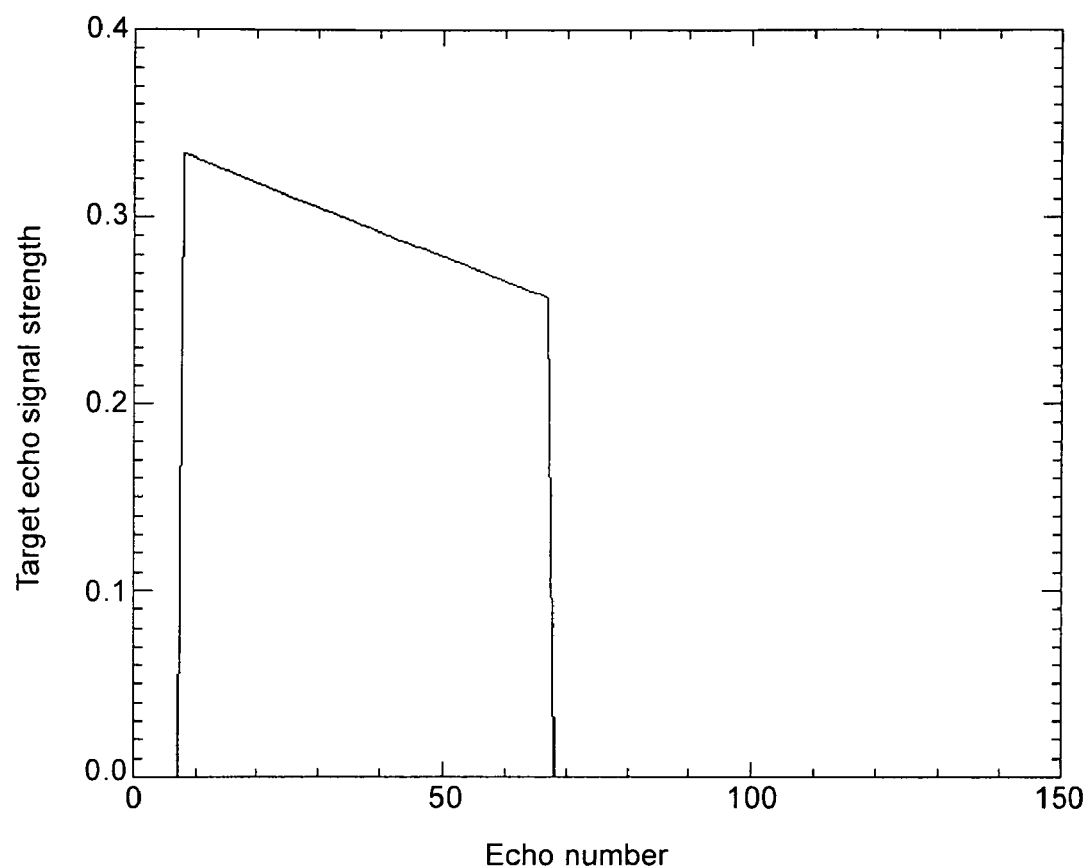
FIGS. 9a, 9b and 9c graphically depict, for the exemplary computer program of the incorporated appendix: (a) an exemplary input target signal specification, (b) the resulting primary output of RF refocus pulse angles, and (c) the resulting secondary output of simulated detectable echo signals.
Figure 9B:
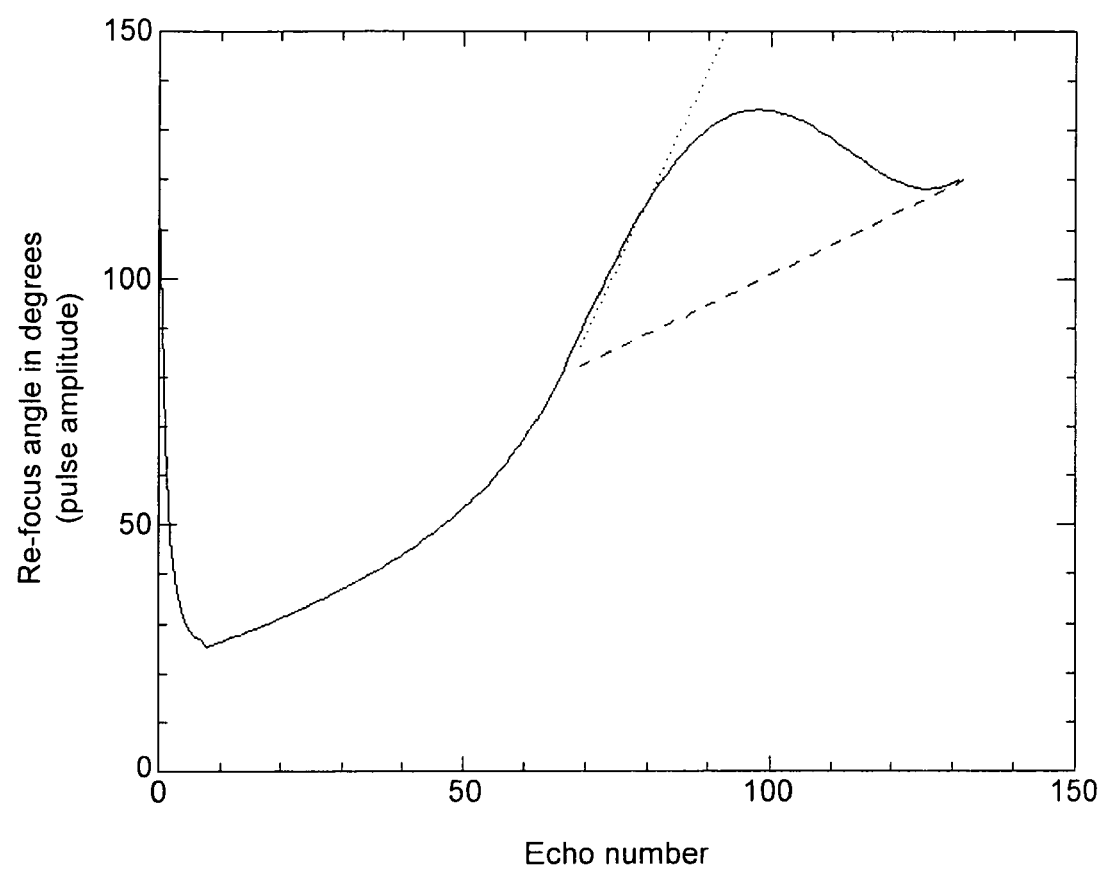
Figure 9C:
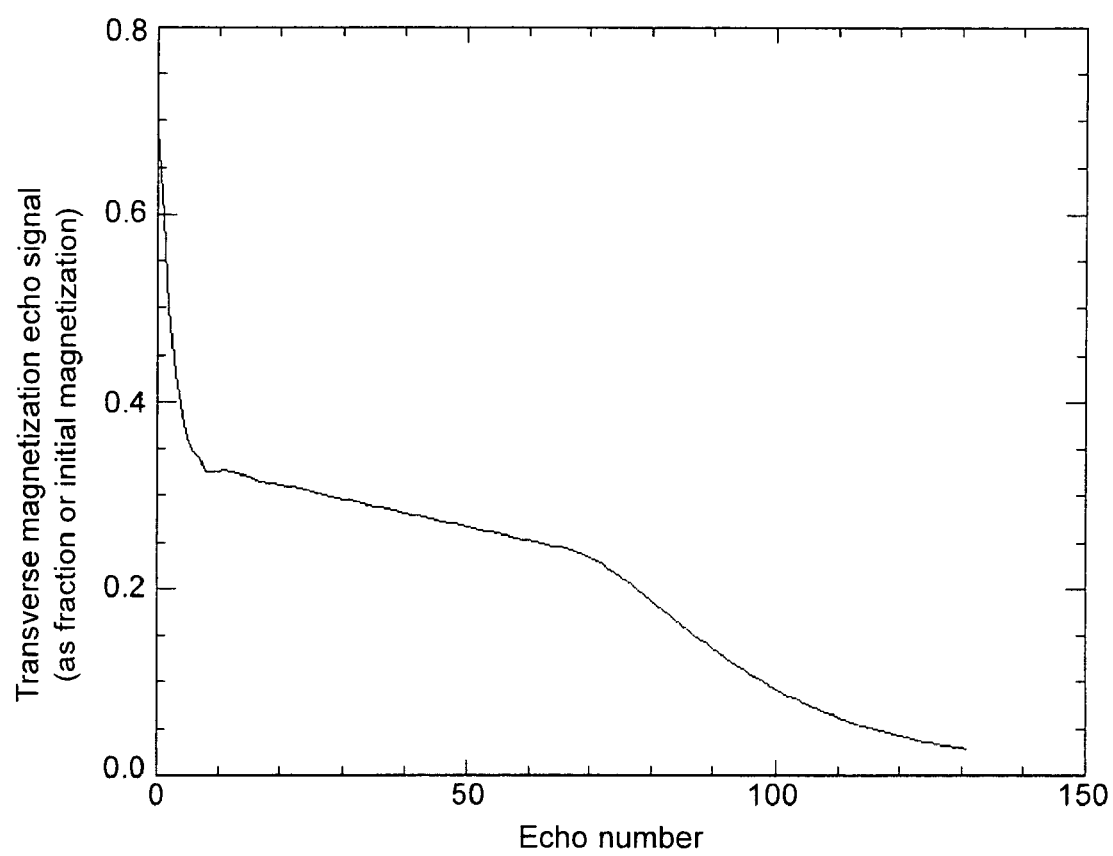

The data shown in FIGS. 9a, 9b and 9c are based on running the above-incorporated lock designer example IDL program using the following design rules:

a—discard first four echoes
b—use transition pulse method to generate first 8 echoes
c—utilize locking T1_rho_offset algorithm for echoes 9-68
d—main echo=echo 68
e—echoes used for image and reconstruction=128
f—total echoes including discards=132
g—second half generated artificially, for smoothness and low SAR, echoes 69-132

The target signal specification is shown as a graph in FIG. 9a where the x axis=echo number and the y axis=transverse signal, as a fraction of initial magnetization.

The primary output result of running this program is graphically depicted in FIG. 9b for calculated refocus angles where the x axis=echo number and the y axis=refocus angle in degrees. The output refocus angle data, in nutation degrees, is also tabulated below (in order from left to right and top to bottom):

| | | | | | |
|---|---|---|---|---|---|
| 116.521 | 67.4111 | 47.3822 | 36.9671 | 31.5513 | 28.7350 |
| 27.2706 | 26.5091 | 25.1853 | 25.6409 | 26.1106 | 26.5780 |
| 27.0513 | 27.5304 | 28.0157 | 28.5074 | 29.0057 | 29.5109 |
| 30.0232 | 30.5430 | 31.0705 | 31.6061 | 32.1501 | 32.7028 |
| 33.2648 | 33.8363 | 34.4178 | 35.0098 | 35.6128 | 36.2274 |
| 36.8540 | 37.4934 | 38.1461 | 38.8129 | 39.4945 | 40.1917 |
| 40.9053 | 41.6364 | 42.3859 | 43.1549 | 43.9445 | 44.7561 |
| 45.5910 | 46.4506 | 47.3367 | 48.2510 | 49.1955 | 50.1722 |
| 51.1836 | 52.2322 | 53.3209 | 54.4529 | 55.6317 | 56.8612 |
| 58.1460 | 59.4909 | 60.9018 | 62.3850 | 63.9478 | 65.5988 |
| 67.3477 | 69.2060 | 71.1871 | 73.3068 | 75.5842 | 78.0423 |
| 80.7092 | 83.6201 | 86.2961 | 88.9619 | 91.6098 | 94.2321 |
| 96.8212 | 99.3698 | 101.871 | 104.317 | 106.701 | 109.018 |
| 111.259 | 113.421 | 115.496 | 117.480 | 119.368 | 121.155 |
| 122.837 | 124.411 | 125.874 | 127.222 | 128.453 | 129.567 |
| 130.561 | 131.435 | 132.190 | 132.824 | 133.340 | 133.739 |
| 134.023 | 134.195 | 134.257 | 134.214 | 134.069 | 133.827 |
| 133.494 | 133.075 | 132.576 | 132.004 | 131.366 | 130.669 |
| 129.921 | 129.130 | 128.306 | 127.456 | 126.589 | 125.716 |
| 124.845 | 123.987 | 123.151 | 122.347 | 121.586 | 120.877 |
| 120.231 | 119.658 | 119.168 | 118.771 | 118.477 | 118.295 |
| 118.236 | 118.308 | 118.520 | 118.881 | 119.400 | 120.000 |

The secondary output result of running this program is graphically depicted in FIG. 9c showing simulated signal, as expected from the designed refocus pulses where the x axis=echo number and the y axis=transverse signal, as a fraction of initial magnetization. The parametric results, performance metrics, etc. associated with the data of FIGS. 9a, 9b, 9c are set forth below:

| | |
|---|---|
| Signal at main echo: | 25.6660% |
| Slope1: | 2.67862 |
| Slope2: | 0.600000 |
| Angle at last echo: | 120.000 |
| Width of window: | 63.0000 |
| Lowest angle: | 25.1853 |
| Angle at main echo: | 83.6201 |
| Highest Angle: | 134.257 |
| Relative_SAR: | 0.262039 |
| TE Equivalent: | 119.732 |
| approximate relative_point_spread = | 1.26872 |

As demonstrated, portions of the RF echo train may be specified by other mechanisms, such as the first few echoes might be specified in some other way with the objective of keeping the range of isochromats close to the steady-state lock angle (e.g., as in FIGS. 8a-8d, steps 806, 808 and 814-828). Another objective may be to smoothly transition the last several echoes to a prescribed RF amplitude which is deemed good for SAR or peak RF constraint reasons.

It is known that maintaining high signal levels and corresponding conspicuous final image intensity for flowing materials like CSF (cerebral spinal fluid) or blood can depend heavily upon the lowest refocusing angles encountered early in the echo train. For such applications, an additional constraint can be added, e.g., that the RF refocusing angle never falls below some separately prescribed minimum.

Within a given design optimization, if the signal substances are described to have longer relaxation times, then the resulting RF waveform will routinely have higher refocusing angles. Taking this to the extreme, if $T1_\rho$ is infinite, then the maximum signal will occur when all of the refocus pulses are allowed to reach 180 degrees. This merely illustrates the point. So if flow characteristics must be improved and moving material needs to be refocused better, one could choose to artificially select higher values of $T1_\rho$ for the design. While not theoretically justified by the traditional value of the $T1_\rho$ of the material, the resulting image may be empirically preferable, especially with regard to areas of moving or flowing substances.

The target signal area to be optimized need not be, for example, a flat signal all the way across the echo train. Rather, it could have some other shape chosen as a good compromise between signal level, point spread and contrast generation. Examples could be a section of linearly decreasing but positive signal level, or a region of signal with a very smooth decay such a section of a Gaussian or an exponential. Such choices in defining reasonable target functions are nearly unlimited.

As a constraint in the optimization, it is reasonable to pick a target value or an acceptable target range of image contrasts. Such a contrast could be explicitly a form of $T1_\rho$ or, alternately, it could include traditional T1 or T2 contrasts, or even more complex objectives.

Isochromats may be chosen to span a relevant physical range, rather than a full cycle of dephasing across a pixel. For example, it would be possible to design for a narrow band of off-resonance frequencies for the brain, without utilizing 360 degree spoiling gradients across a pixel.

The $T1_\rho$ used to compute the off-resonance $T1_\rho^{off}$ could be made to depend upon a nominal RF amplitude or a local RF amplitude that is relevant to some part of the echo train. In the literature, $T1_\rho$ depends upon a frequency in the rotating frame. The method of this technique can be applied either with a simple fixed $T1_\rho$, or with one which is frequency dependent. If frequency-dependence is included, it should preferably come from an average rotation rate over an echo-to-echo interval, not just the frequency associated with time when the RF pulse is switched on.

Two or more sequences may be designed as a pair so that the difference in signal depends directly upon $T1_\rho$, for example. Then, such sequences could be used for direct quantification of $T1_\rho$.

Until now, the method has been described using RF refocusing pulses that are spatially non-selective (i.e., occurring without any accompanying gradient magnetic field). But clearly the method could be extended to spatially selective RF refocusing pulses, or even spatial-spectral pulses. A brute force method for such an extension is to increase the number of isochromats so that it depends upon a higher dimensional set of frequency factors. A single "isochromat" to track in the simulation might now be described by both a frequency along a slice select gradient magnetic field (which is now present nominally during RF transmit pulses), and an off-resonance frequency term that is present both during RF pulses and between RF pulses.

The exemplary embodiments which have been described take advantage of some common simple features of CPMG FSE pulse sequence implementations. These features are not essential to the method however. In the exemplary embodiments, RF pulses are applied at the resonant frequency of the Larmor rotating frame. In the exemplary embodiments, detectable signal at the time of each echo is sufficiently described by the $M_x$ component, and does not require explicit analysis of the $M_y$ component. However, the method can be readily adapted by those skilled in the art for use in cases where these and other simple pulse sequence features are not met.

Among the advantages that can be realized using one or more of the exemplary embodiments are the following:
 (1) fast, efficient calculation of isochromats;
 (2) more appropriate model and better accuracy for materials in which $T1_\rho$ is significantly different than T2;
 (3) could potentially be used to design FSE sequences that are explicitly meant to study spin-lock or $T1_\rho$ contrast mechanisms or similar mechanisms that alter relaxation rates;
 (4) calculates directly the signal or the RF pulses for the main steady state or "locked" part of the signal, which is often the part of the image that does not produce artifacts;
 (5) does not require an integer number of complete cycles of rephasing in an echo-echo interval; and
 (6) does not require each echo-echo interval to have identical timing and identical gradient moments.

As those in the art will appreciate, many variations and/or modifications of the above-described exemplary embodiments may be made while still obtaining one or more advantageous novel features. All such modifications are intended to be included with the scope of the appended claims.

What is claimed is:

1. A machine-implemented method for designing a variable flip angle MRI echo train based on a target train of detectable spin-locked NMR echo signal amplitudes, said method comprising the use of at least one programmed computer system configured to:
 (a) determine and store in non-transitory memory a next RF refocusing pulse amplitude, in a train of NMR spin-locking RF refocusing pulses, based on (i) net NMR magnetization amplitude which produced a prior spin echo at a particular NMR spin-locking angle, after being decayed over time to a next target spin echo time, and (ii) a new NMR spin-locking angle required to obtain the next target detectable transverse spin echo signal component magnitude; and
 (b) repeat step (a) for a succession of target NMR spin echoes.

2. A machine-implemented method as in claim 1, wherein said at least one programmed computer system is further configured to:
 (c) output a succession of said determined RF refocusing pulse amplitudes for visual inspection via a display screen or printer.

3. A machine-implemented method as in claim 1, wherein said at least one programmed computer system is further configured to:
 (c) transfer the succession of determined RF refocusing pulse amplitudes to an MRI sequence controller as a variable echo train MRI sequence template; and (d) use said template to control a variable train spin echo MRI diagnostic patient scan.

4. A machine-implemented method as in claim 1, wherein said at least one programmed computer system is further configured to:
(c) store a value of NMR net magnetization magnitude for each successive echo thus tracking the evolution and progression of spin-locked net magnetizations occurring in the designed sequence.

5. A machine-implemented method as in claim 1, wherein said at least one programmed computer system is configured so that:
for each of plural off-resonant isochromats, (i) decay of net NMR magnetization from one spin echo occurrence to the next is calculated using $T1_\rho$ decay for spin-locked magnetization at angle δ1, (ii) a new spin-locked angle δ2 is determined as that required to produce target detectable transverse magnetization for next target echo, and (iii) a corresponding required B1 magnitude of next RF refocusing pulse is computed based on new spin-locking angle δ2;
the calculated results for all said isochromats is combined to determine B1 magnitude for the next RF refocusing pulse;
the resultant B1 magnitude for the next RF refocusing pulse in said sequence is stored in a digital storage medium; and
the above steps are repeated for successive MRI spin echoes in said target sequence.

6. A machine-implemented method as in claim 5, wherein said at least one programmed computer system is further configured to:
output the succession of resultant B1 magnitudes for visual inspection via a display screen or printer.

7. A machine-implemented method as in claim 5, wherein said at least one programmed computer system is further configured to:
transfer the succession of resultant B1 magnitudes to an MRI sequence controller as a variable echo train MRI sequence template; and
use said template to control a variable train spin echo MRI diagnostic patient scan.

8. A machine-implemented method as in claim 5, wherein said at least one programmed computer system is further configured to:
store calculated values of net magnetization magnitude for each successive echo in the target train thus tracking the evolution and progression of spin-locked net magnetizations occurring in the designed sequence.

9. A machine-implemented method as in claim 5, wherein the magnitude of the next RF refocusing pulse for an off-resonant isochromat is calculated based upon the following relationship:

$$\delta = \arccos\sqrt{\frac{1+\cot^2\beta}{1+\cot^2\beta+\cot^2(\alpha/2)}}$$

where:
δ=the next spin-lock angle that which has been determined as required to obtain a target transverse signal component based on magnetization decay;
β=the angle of magnetization rotation that will have occurred due to off-resonance during one relevant time interval, i.e., one-half an inter-echo spacing in the time domain; and
α=a magnetization nutation angle to be effected by the next RF refocusing pulse.

10. A non-transitory digital storage medium containing executable computer program code which, when executed by at least one computer, effects the method of claim 1.

11. Apparatus for designing a variable echo MRI train based on a proposed target train of detectable spin-locked NMR echo signal amplitudes, said apparatus comprising at least one programmed computer system which is configured to:
(a) determine and store in non-transitory memory a next RF refocusing pulse amplitude, in a train of spin-locking RF refocusing pulses, based on (i) net magnetization amplitude which produced a prior echo at a particular spin-locking angle after being decayed over a time period to a next target echo time, and (ii) a new spin-locking angle required to obtain the next target detectable transverse echo signal component magnitude; and
(b) repeat step (a) for a succession of target NMR spin echoes.

12. Apparatus as in claim 11 being further configured to:
output a succession of said determined RF refocusing pulse amplitudes for visual inspection via a display screen or printer.

13. Apparatus as in claim 11 being further configured to:
transfer the succession of determined RF refocusing pulse amplitudes to an MRI sequence controller as a variable echo train MRI sequence template; and
use said template to control a variable train spin echo MRI diagnostic patient scan.

14. Apparatus as in claim 11 being further configured to:
store a value of NMR net magnetization magnitude for each successive echo thus tracking the evolution and progression of spin-locked net magnetizations occurring in the designed sequence.

15. Apparatus as in claim 11, wherein:
for each of plural off-resonant isochromats, (i) decay of net NMR magnetization from one spin echo occurrence to the next is calculated using $T1_\rho$ decay for spin-locked magnetization at angle δ1, (ii) a new spin-locked angle δ2 is determined as that which is required to produce target detectable transverse magnetization for next target echo, and (iii) a corresponding required B1 magnitude of a next RF refocusing pulse is computed based on new spin-locking angle δ2;
the calculated results for all said isochromats is combined to determine B1 magnitude for the next RF refocusing pulse;
the resultant B1 magnitude for the next RF refocusing pulse in said sequence is stored in a digital storage medium; and
the above steps are repeated for successive MRI spin echoes in said target sequence.

16. Apparatus as in claim 15 being further configured to:
output the succession of resultant B1 magnitudes for visual inspection via a display screen or printer.

17. Apparatus as in claim 15 being further configured to:
transfer the succession of resultant B1 magnitudes to an MRI sequence controller as a variable echo train MRI sequence template; and
use said template to control a variable train spin echo MRI diagnostic patient scan.

18. Apparatus as in claim 15 being further configured to:
store calculated values of net magnetization magnitude for each successive echo in the target train thus tracking the evolution and progression of spin-locked net magnetizations occurring in the designed sequence.

19. Apparatus as in claim 15, wherein the magnitude of the next RF refocusing pulse for an off-resonant isochromat is calculated based upon the following relationship:

$$\delta = \arccos\sqrt{\frac{1+\cot^2\beta}{1+\cot^2\beta+\cot^2(\alpha/2)}}$$

where:
- $\delta$=the next spin-locking angle which is determined to be required to obtain a target transverse signal component based on magnetization decay over time;
- $\beta$=the angle of magnetization rotation that will have occurred due to off-resonance during one relevant time interval, i.e., one-half an inter-echo spacing in the time domain; and
- $\alpha$=a magnetization nutation angle to be effected by the next RF refocusing pulse.

20. A machine-implemented method for estimating expected MRI signal and/or image values in multiple RF echo pulse sequences, utilizing $T1_\rho^{offset}$, said method comprising the use of at least one programmed computer system configured to:

(a) determine and store in non-transitory memory a next RF echo pulse signal amplitude in a multiple RF echo pulse sequence, based on (i) net NMR magnetization amplitude which produced a prior spin echo at a particular NMR spin-locking angle $\delta1$, after being decayed over time to a next target spin echo time using $T1_\rho^{offset}$, and (ii) a new NMR spin-locking angle $\delta2$ corresponding to a next RF refocusing pulse amplitude; and (b) repeat step (a) for a succession of target NMR spin echo times.

21. A magnetic resonance imaging (MRI) apparatus for generating a series of spin echoes using RF refocusing pulses, said apparatus comprising:
- an MRI scanner system including a gantry housing a static magnetic field generator, gradient magnetic field generators and at least one RF antenna coil; and
- a calculator configured to compute refocusing angles of the RF refocusing pulses for a variable flip angle (VFA) MRI pulse sequence based on T1 and $T1_\rho$ values where $T1_\rho$ represents decay of net locked magnetization for spin-locked nuclear magnetic resonant nuclei.

22. A magnetic resonance imaging apparatus as in claim 21 further comprising:
- a designating unit configured to select a desired target image contrast in plural scan conditions, and
- a non-transitory memory configured to store T1 and $T1_\rho$ values corresponding to plural imaging regions,
- wherein said calculator is configured to compute the refocusing angles for at least some echoes based on the selected target image contrast and the stored T1 and $T1_\rho$ values.

* * * * *